United States Patent
Kuo et al.

(10) Patent No.: US 9,410,557 B2
(45) Date of Patent: Aug. 9, 2016

(54) COOLING FAN WITH VARIABLE BLADE SURFACE AREA

(71) Applicant: Acer Incorporated, New Taipei (TW)

(72) Inventors: Chun-Chih Kuo, New Taipei (TW); Che-Wei Lin, New Taipei (TW)

(73) Assignee: Acer Incorporated, New Taipei (TW)

( * ) Notice: Subject to any disclaimer, the term of this patent is extended or adjusted under 35 U.S.C. 154(b) by 611 days.

(21) Appl. No.: 13/798,113

(22) Filed: Mar. 13, 2013

(65) Prior Publication Data

US 2014/0193242 A1 Jul. 10, 2014

(30) Foreign Application Priority Data

Jan. 7, 2013 (TW) .............................. 102100454 A

(51) Int. Cl.

| | |
|---|---|
| F04D 29/30 | (2006.01) |
| F04D 29/34 | (2006.01) |
| F04D 29/28 | (2006.01) |
| F04D 29/38 | (2006.01) |
| H05K 7/20 | (2006.01) |
| G06F 7/20 | (2006.01) |
| F04D 27/00 | (2006.01) |
| G06F 1/20 | (2006.01) |

(52) U.S. Cl.
CPC .............. *F04D 29/30* (2013.01); *F04D 27/002* (2013.01); *F04D 29/281* (2013.01); *F04D 29/282* (2013.01); *F04D 29/34* (2013.01); *F04D 29/38* (2013.01); *F04D 29/382* (2013.01); *G06F 1/20* (2013.01); *H05K 7/20136* (2013.01)

(58) Field of Classification Search
CPC ..................... H05K 7/20136; F05D 2250/311; F05D 2250/90; F04D 25/08; F04D 25/16; F04D 27/002; F04D 27/0246; F04D 29/263; F04D 29/281; F04D 29/282; F04D 29/287; F04D 29/30; F04D 29/34; F04D 29/36; F04D 29/362; F04D 29/38
See application file for complete search history.

(56) References Cited

U.S. PATENT DOCUMENTS

| | | | |
|---|---|---|---|
| 5,207,557 A | 5/1993 | Smiley, III et al. | |
| 6,572,336 B2 * | 6/2003 | Horng et al. | 416/183 |
| 2002/0054478 A1 * | 5/2002 | Hidesawa | 361/687 |
| 2006/0093485 A1 * | 5/2006 | Horng et al. | 416/198 R |
| 2007/0092376 A1 * | 4/2007 | Malone et al. | 416/143 |
| 2007/0121292 A1 * | 5/2007 | Ariga | 361/695 |

FOREIGN PATENT DOCUMENTS

JP S48805 1/1973

* cited by examiner

*Primary Examiner* — Bryan Lettman
*Assistant Examiner* — Timothy P Solak
(74) *Attorney, Agent, or Firm* — Jianq Chyun IP Office

(57) ABSTRACT

A fan module including a first fan, a second fan and an actuator is provided. The first fan has a first pivot portion and a plurality of first fan blades. Each first fan blade has a first blade face. The second fan has a second pivot portion and a plurality of second fan blades corresponding to the first fan blades. Each second fan blade has a second blade face. The second pivot portion is slidably disposed at a containing cavity of the first pivot portion. The actuator is adapted to drive the first fan to rotate. The first fan is adapted to drive the second fan to rotate. When the second pivot portion protrudes out of the containing cavity, a part of each of the second blade faces does not overlap with the corresponding first blade face along a direction perpendicular to the corresponding first blade face.

9 Claims, 5 Drawing Sheets

COOLING FAN WITH VARIABLE BLADE SURFACE AREA

CROSS-REFERENCE TO RELATED APPLICATION

This application claims the priority benefit of Taiwan application serial no. 102100454, filed on Jan. 7, 2013. The entirety of the above-mentioned patent application is hereby incorporated by reference herein and made a part of this specification.

TECHNICAL FIELD

The disclosure relates to a heat dissipation module, and particularly relates to a fan module.

BACKGROUND

In the so-called "information explosion era" nowadays, electronic devices become inseparable from our daily life. With the continuous advance of technology, electronic devices featuring light weight, slimness, and a tiny and compact size keep hitting the market. Desktop personal computers (desktop PC) are the firstly developed products in the development and application of personal computers. However, the desktop PCs have a larger size, making them harder to carry around. Therefore, notebook PCs that are convenient for carriage are then developed.

For the consideration of convenient carriage, miniature notebook PCs has become the trend in the notebook PC designs. Generally speaking, a notebook PC is usually disposed with a fan for dissipating heat generated by heat-generating elements inside the notebook PC. In response to the trend of miniature notebook PCs, the size of the fan tends to be limited, making it not able to provide a larger fan blade size to provide a sufficient air flow for heat dissipation. A common solution is to reduce the system performance of the notebook PC, so as to reduce heat generated during operation of the notebook computer. However, the solution does not fundamentally touch upon the issue that the fan is not of enough heat dissipation ability. Another solution is to increase the fan speed, so as to provide a sufficient air flow for heat dissipation. However, increasing the fan speed results in a louder noise that disturbs the user.

SUMMARY

The disclosure provides a fan module that improves a heat-dissipating efficiency by adjusting a fan blade size of a fan.

The disclosure provides a fan module for an electronic device. The fan module includes a first fan, a second fan, and an actuator. The first fan has a first pivot portion and a plurality of first fan blades. Each of the first fan blades is connected to the first pivot portion and has a first blade face. The first pivot portion has a first containing cavity. The second fan has a second pivot portion and a plurality of second fan blades. Each of the second fan blades is connected to the second pivot portion and has a second blade face. The second pivot portion is slidably disposed in the first containing cavity along an axis. The second fan blades respectively correspond to the first fan blades. The actuator is coupled to the first pivot portion and drives the first fan to rotate around the axis. The first fan drives the second fan to rotate around the axis. When the second pivot portion slides to a first position to protrude out of the first containing cavity, a portion of each of the second blade faces does not overlap with a corresponding one of the first blade faces in a direction perpendicular to the corresponding first blade face. When the second pivot portion slides to a second position to be disposed in the first containing cavity, the portion of each of the second blade faces overlaps with the corresponding first blade face in the direction perpendicular to the corresponding first blade face.

In view of the foregoing, in the disclosure, the second pivot portion of the second fan is slidably disposed in the first containing cavity of the first pivot portion of the first fan, so as to allow the second pivot portion to slide relative to the first pivot portion to protrude out of the first containing cavity or be located in the first containing cavity. Given that the electronic device is in a high power consumption mode that generates more heat, the second pivot portion located in the first containing cavity may protrude out of the first containing cavity to drive the second blade faces of the second fan blades to move relative to the first blade faces of the first fan blades, thereby making a portion of each of the second blade faces not overlap with the corresponding first blade face and allowing the first blade faces and the second blade faces form a larger fan blade size to provide a more sufficient air flow for heat dissipation. Since the disclosure increases the blade face size to improve the heat dissipation efficiency in the way described above instead of increasing fan speed to improve the heat dissipation efficiency, the fan module is prevented from causing a noise that disturbs the user. In addition, when the electronic device is not in a high power consumption mode and therefore generates less heat, the second pivot portion may move into the first containing cavity to drive each of the second fan blades to restore to the original position, allowing the portion of each of the second blade faces to overlap with the corresponding first blade face, thereby keeping the fan module thinner to meet the trend of miniature electronic devices.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the application.

DETAILED DESCRIPTION OF DISCLOSED EMBODIMENTS

Figure 1:
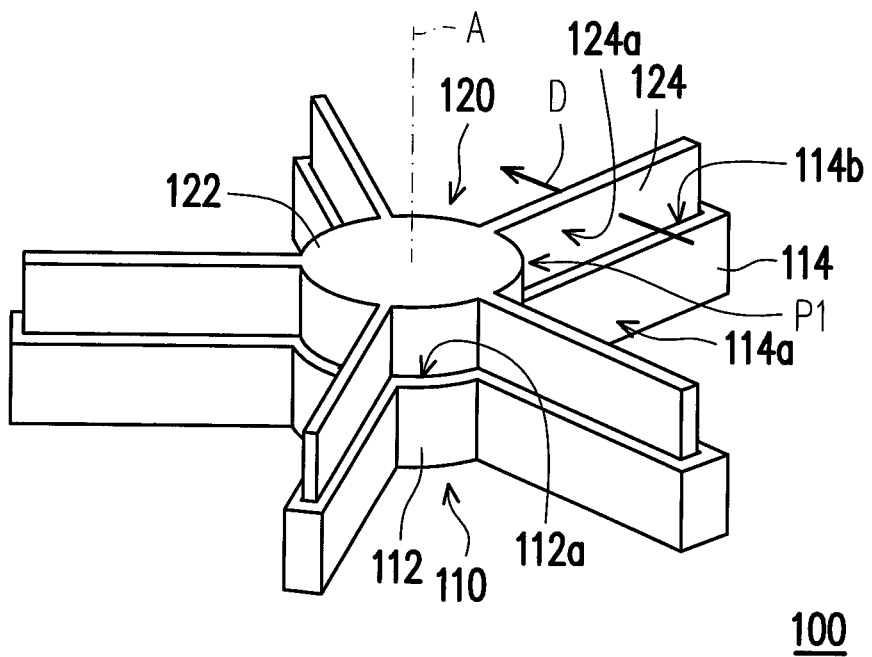
FIG. 1 is a perspective view of a fan module according to an embodiment of the disclosure.
Figure 2:
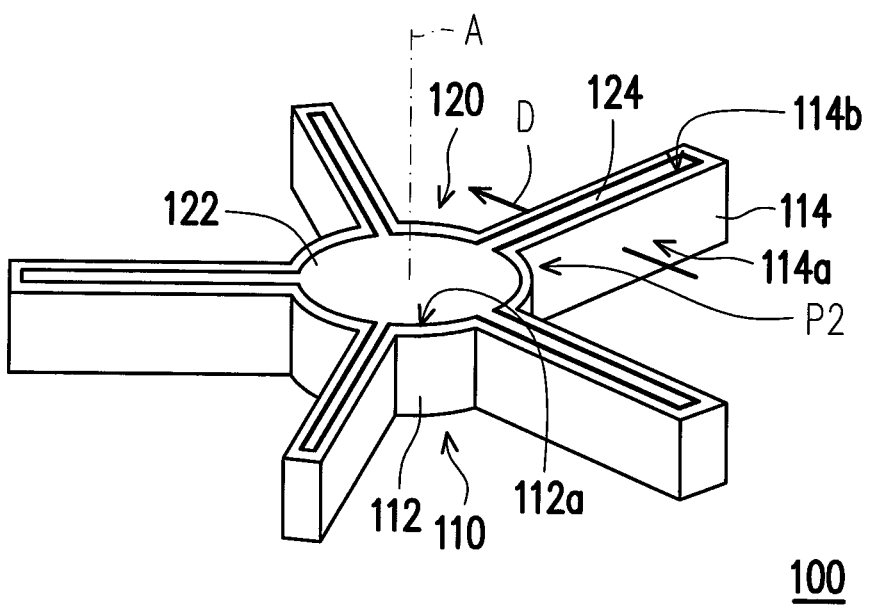
FIG. 2 is a perspective view illustrating a second fan hidden in a first fan in FIG. 1.
Figure 3:
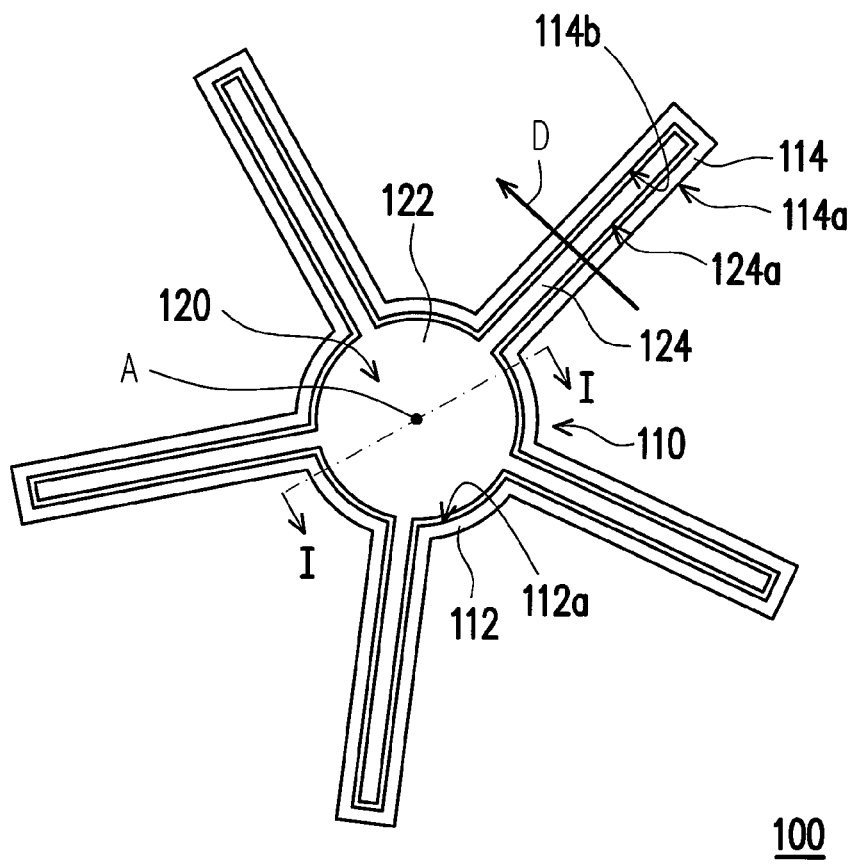
FIG. 3 is a top view of the fan module of FIG. 2.

FIG. 1 is a perspective view of a fan module according to an embodiment of the disclosure. FIG. 2 is a perspective view illustrating a second fan hidden in a first fan in FIG. 1. FIG. 3 is a top view of the fan module of FIG. 2. Referring to FIGS.

1-3, a fan module 100 of this embodiment dissipates heat of an electronic device and includes a first fan 110 and a second fan 120. The electronic device is a notebook, for example. The first fan 110 has a first pivot portion 112 and a plurality of first fan blades 114. The first pivot portion 112 has a first containing cavity 112a, and each of the first fan blades 114 is connected to the first pivot portion 112 and has a first blade face 114a and a second containing cavity 114b. The second fan 120 has a second pivot portion 122 and a plurality of second fan blades 124. Each of the second fan blades 124 is connected to the second pivot portion 122 and has a second blade face 124a. The second pivot portion 122 of the second fan 120 is slidably disposed along an axis A in the first containing cavity 112a of the first pivot portion 112, wherein the first blade faces 114a and the second blade faces 124a are parallel to the axis A. The second fan blades 124 of the second fan 120 respectively correspond to the first fan blades 114 of the first fan 110.

When the second pivot portion 122 of the second fan 120 slides to a first position P1 indicated in FIG. 1 to protrude out of the first containing cavity 112a of the first pivot portion 112, each of the second fan blades 124 protrudes from a corresponding one of the second containing cavities 114b, such that a portion of each of the second blade faces 124a (i.e. a portion of each of the second blade faces 124a that is exposed out of the corresponding second containing cavity 114b) does not overlap with a corresponding one of the first fan faces 114a in a direction D perpendicular to the corresponding first blade face 114a. When the second pivot portion 122 of the second fan 120 slides to a second position P2 indicated in FIG. 2 to be located in the first containing cavity 112a of the first pivot portion 112, each of the second fan blades 124 is located in the corresponding second containing cavity 114b, the portion of each of the second blade faces 124a that is exposed out of the corresponding second containing cavity 114b shown in FIG. 1 is hidden in the corresponding second containing cavity 114b, such that the portion of each of the second blade faces 124a overlaps with the corresponding first blade face 114a in the direction D perpendicular to the corresponding first blade face 114a.

In such configuration, given that the electronic device is in a high power consumption mode that generates more heat, the second pivot portion 122 located in the first containing cavity 112a may protrude out of the first containing cavity 112a to drive the second blade faces 124a of the second fan blades 124 to move relative to the first blade faces 114a of the first fan blades 114, thereby making the portion of each of the second blade faces 124a not overlap with the corresponding first blade face 114a and allowing the first blade faces 114a and the second blade faces 124a form a larger fan blade size to provide a more sufficient air flow for heat dissipation. Since this embodiment increases the blade face size to improve a heat dissipation efficiency in the way described above instead of increasing fan speed to improve the heat dissipation efficiency, the fan module 100 is prevented from causing a noise that disturbs the user. In addition, when the electronic device is not in a high power consumption mode and therefore generates less heat, the second pivot portion 122 may move into the first containing cavity 112a to drive each of the second fan blades 124 to restore to an original position, allowing the portion of each of the second blade faces 124a to overlap with the corresponding first blade face 114a, thereby keeping the fan module 100 thinner to meet the trend of miniature electronic devices.

Figure 4:
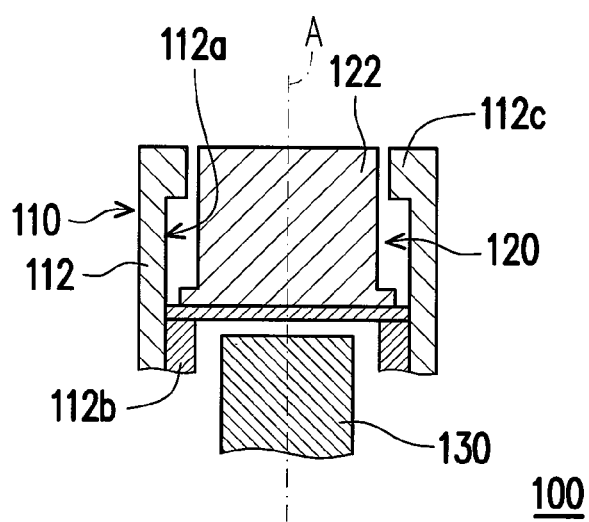
FIG. 4 is a cross-sectional view of the fan module of FIG. 3 along line I-I.
Figure 5:
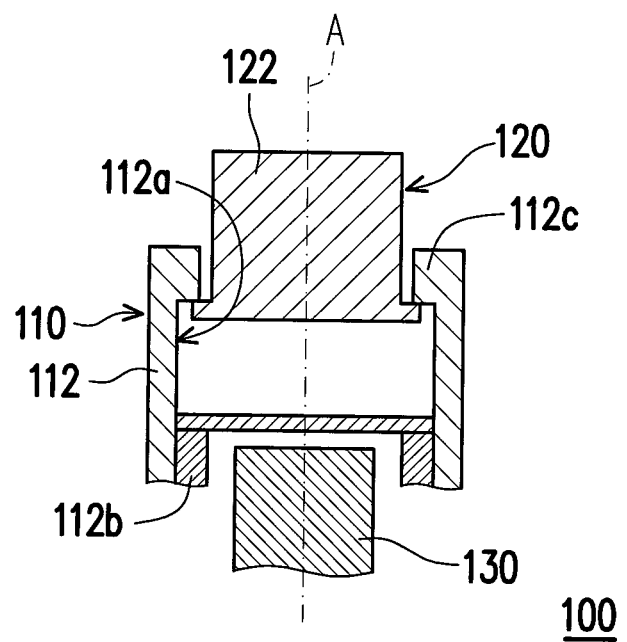
FIG. 5 is a cross-sectional view illustrating a second pivot portion protruding out of a first containing cavity of FIG. 4.

FIG. 4 is a cross-sectional view of the fan module of FIG. 3 along line I-I. FIG. 5 is a cross-sectional view illustrating a second pivot portion protruding out of a first containing cavity of FIG. 4. Referring to FIGS. 4 and 5, the fan module 100 further includes an actuator 130. The actuator 130 is coupled to the first pivot portion 112 of the first fan 110 and drives the first fan 110 to rotate around the axis A. When the first fan 110 is driven by the actuator 130, the first fan 110 drives the second fan 120 to rotate around the axis A. More specifically, the actuator 130 may include at least one coil, the first pivot portion 112 has a magnetic element 112b (e.g. a permanent magnet). The actuator 130 is located in the first containing cavity 112a, the magnetic element 112b is disposed in the first containing cavity 112a and corresponds to the coil (actuator 130). The actuator 130 and the first pivot portion 112 may be respectively considered as a stator and a rotor, thereby driving the first pivot portion 112 to rotate relative to the actuator 130.

Referring to FIGS. 4 and 5, in this embodiment, the first pivot portion 112 has a stopping portion 112c in the first containing cavity 112a. When the second pivot portion 112 is located at the first position P1 (indicated in FIG. 1), as shown in FIGS. 1 and 5, to protrude out of the first containing cavity 112a, the stopping portion 112c and the second pivot portion 122 interfere to stop the second pivot portion 122 to from being separated from the first pivot portion 112. In other embodiments, other structures in an appropriate form may be used to prevent the second pivot portion 122 from being separated from the first pivot portion 112. The disclosure is not limited thereto.

Figure 6:
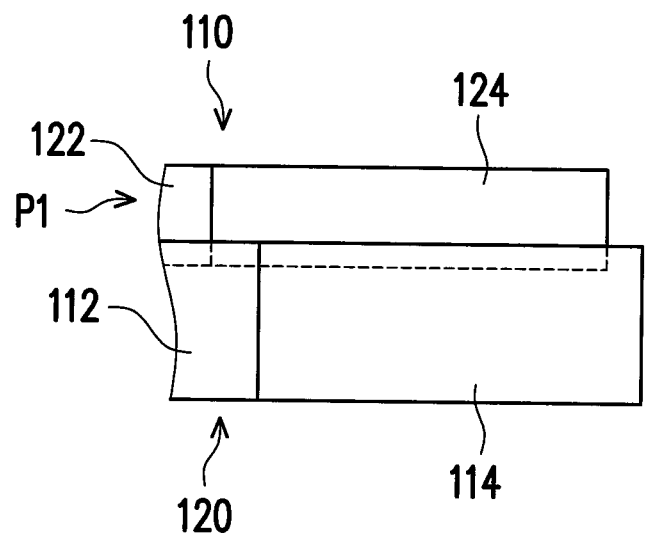
FIG. 6 is a partial side view of the fan module of FIG. 1.

FIG. 6 is a partial side view of the fan module of FIG. 1. Referring to FIGS. 1 and 6, specifically speaking, when the second pivot portion 122 is located at the first position P1 to protrude out of the first containing cavity 112a (indicated in FIG. 1), each of the second fan blades 124 is partially located in the corresponding second containing cavity 114b (indicated in FIG. 1) to interfere with the corresponding first fan blade 114 as indicated in a broken line shown in FIG. 6, such that the first fan blades 114 are allowed to drive the second fan blades 124 to rotate.

Figure 7:
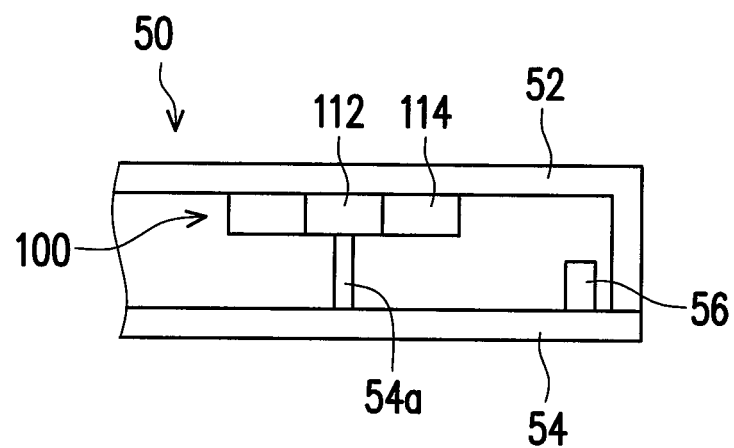
FIGS. 7 and 8 are schematic views illustrating the fan module of FIG. 1 installed in an electronic device.
Figure 8:
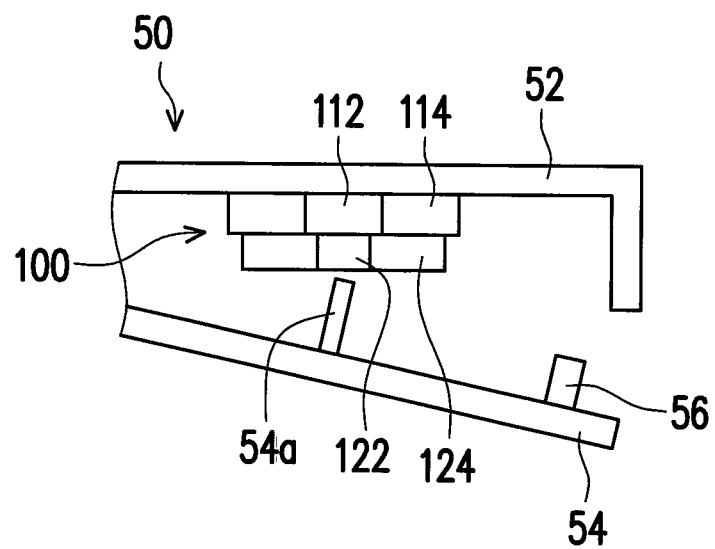

FIGS. 7 and 8 are schematic views illustrating the fan module of FIG. 1 installed in an electronic device. Referring to FIGS. 7 and 8, an electronic device 50 is a host of a notebook computer and includes a main body 52, a cover body 54, and a connection port 56. The connection port 56 is disposed on the cover body 54, and the cover body 54 is closed relative to the main body 52 to hide the connection port 56 inside the main body 52, as shown in FIG. 7. Alternatively, as shown in FIG. 8, the cover body 54 may be open relative to the main body 52 to expose the connection port 56. When the fan module 100 is installed in the electronic device 50, through an operation of opening and closing of the cover body 54 and the main body 52, the second fan 120 may be driven to move relative to the first fan 110 between states shown in FIGS. 1 and 2. The details are explicated below.

The fan module 110 is disposed in one of the main body 52 and the cover body 54 (illustrated to be the main body 52). When the cover body 54 is closed relative to the main body 52, as shown in FIG. 7, another of the main body 52 and the cover body 54 (illustrated to be the cover body 54 and a pillar 54a of the cover body 54) pushes the second pivot portion 122 to position-limit the second pivot portion 122 in the first containing cavity 122a, as the state shown in FIG. 2. At this time, the electronic device 50 may have a thinner and lighter appearance. When the cover body 54 is open relative to the main body 52, as shown in FIG. 8, the second pivot portion 122 is no longer position-limited in the first containing cavity 112a and protrudes out of the first containing cavity 112a due to gravity, as shown in FIG. 1. At this time, the first fan blades 114 and the second fan blades 124 form a larger fan blade size to allow the fan module 100 to provide a more sufficient air flow for heat dissipation.

Figure 9:
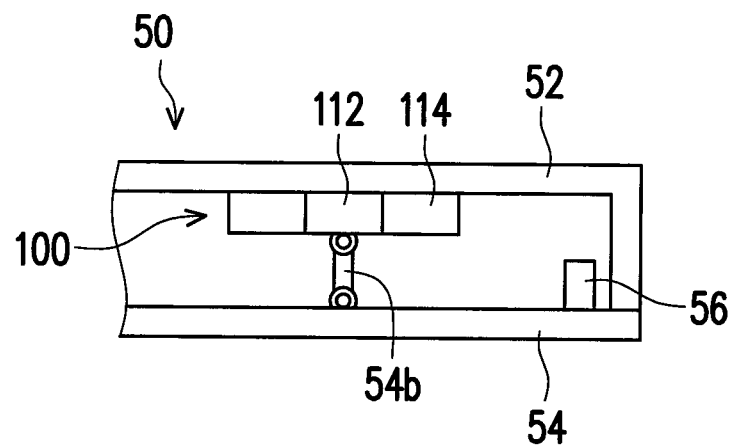
FIGS. 9 and 10 are schematic views illustrating the fan module of FIG. 1 installed in an electronic device.
Figure 10:
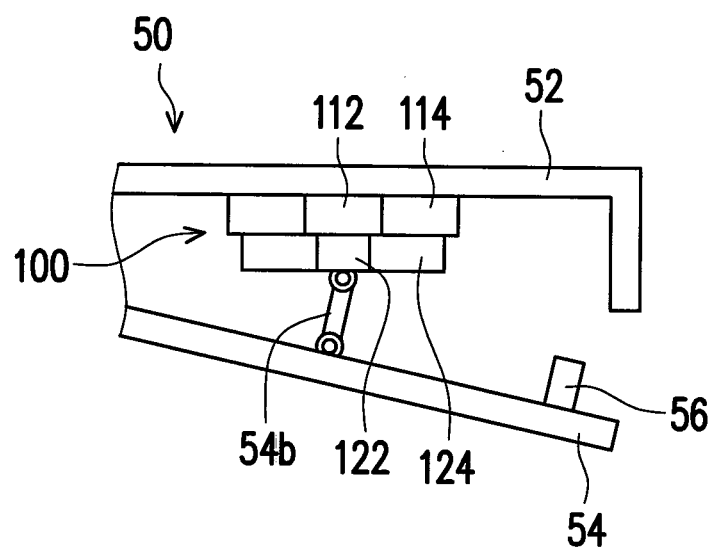

The disclosure does not limit on an operation for the main body 52 and the cover body 54 to drive the second pivot portion 122. Details in this respect are provided below with the accompanying drawings as an illustrative example. FIGS. 9 and 10 are schematic views illustrating the fan module of FIG. 1 installed in an electronic device. In embodiments illustrated in FIGS. 9 and 10, the pillar 54a shown in FIGS. 7 and 8 are replaced by a linking mechanism 54b (illustrated to be a link rod). Specifically speaking, the linking mechanism 54b is disposed in one of the main body 52 and the cover body 54 (illustrated to be the cover body 54) and connected to the second pivot portion 122. When the cover body 54 is closed relative to the main body 52, as shown in FIG. 9, the linking mechanism 54b pushes the second pivot portion 122 to position-limit the second pivot portion 122 in the first containing cavity 112a, as in the state shown in FIG. 2. When the cover body 54 is open relative to the main body 52, as shown in FIG. 10, the linking mechanism 54b drives the second pivot portion 122 to protrude out of the first containing cavity 112a, as in the state shown in FIG. 1. In other embodiments, an appropriate mechanism in another form may be used to drive the second pivot portion 122 to operate between the states illustrated in FIGS. 9 and 10. The disclosure is not limited thereto.

In view of the foregoing, in the disclosure, the second pivot portion of the second fan is slidably disposed in the first containing cavity of the first pivot portion of the first fan, so as to allow the second pivot portion to slide relative to the first pivot portion to protrude out of the first containing cavity or be located in the first containing cavity. Given that the electronic device is in a high power consumption mode that generates more heat, the second pivot portion located in the first containing cavity may protrude out of the first containing cavity to drive the second blade faces of the second fan blades to move relative to the first blade faces of the first fan blades, thereby making a portion of each of the second blade faces not overlap with the corresponding first blade face and allowing the first blade faces and the second blade faces form a larger fan blade size to provide a more sufficient air flow for heat dissipation. Since the disclosure increases the blade face size to improve the heat dissipation efficiency in the way described above instead of increasing fan speed to improve the heat dissipation efficiency, the fan module is prevented from causing a noise that disturbs the user. In addition, when the electronic device is not in a high power consumption mode and therefore generates less heat, the second pivot portion may move into the first containing cavity to drive each of the second fan blades to restore to the original position, allowing the portion of each of the second blade faces to overlap with the corresponding first blade face, thereby keeping the fan module thinner to meet the trend of miniature electronic devices.

It will be apparent to those skilled in the art that various modifications and variations can be made to the structure of the disclosed embodiments without departing from the scope or spirit of the application. In view of the foregoing, it is intended that the application cover modifications and variations of this application provided they fall within the scope of the following claims and their equivalents.

What is claimed is:

1. A fan module for an electronic device, comprising:
a first fan, having a first pivot portion and a plurality of first fan blades, wherein each of the first fan blades is connected to the first pivot portion and has a first blade face, and the first pivot portion has a first containing cavity;
a second fan, having a second pivot portion and a plurality of second fan blades, wherein each of the second fan blades is connected to the second pivot portion and has a second blade face, the second pivot portion is slidably disposed in the first containing cavity along an axis, and the second fan blades respectively correspond to the first fan blades; and
an actuator, coupled to the first pivot portion for driving the first fan to rotate around the axis, wherein the first fan drives the second fan to rotate around the axis,
wherein when the second pivot portion slides to a first position to protrude out of the first containing cavity, a portion of each of the second blade faces does not overlap with a corresponding one of the first blade faces in a direction perpendicular to the corresponding first blade face,
wherein each of the first fan blades has a second containing cavity, when the second pivot portion is located at the first position, each of the second fan blades protrudes out of a corresponding one of the second containing cavities, and when the second pivot portion is located at the second position, each of the second fan blades is located in the corresponding second containing cavity.

2. The fan module as claimed in claim 1, wherein when the second pivot portion slides to a second position to be located in the first containing cavity, the portion of each of the second blade faces overlaps with the corresponding first blade face in the direction perpendicular to the corresponding first blade face,
wherein each of the first blade faces and each of the second blade faces are parallel to the axis.

3. The fan module as claimed in claim 1, wherein when the second pivot portion is located at the first position, each of the second fan blades is partially located in the corresponding second containing cavity to interfere with the corresponding first fan blade, such that the first fan blades drive the second fan blades to rotate.

4. The fan module as claimed in claim 1, wherein the first pivot portion has a stopping portion in the first containing cavity, when the second pivot portion is located at the first position, the stopping portion stops the second pivot portion from being separated from the first pivot portion.

5. The fan module as claimed in claim 1, wherein the actuator comprises at least one coil and is located in the first containing cavity, and the first pivot portion has a magnetic element disposed in the first containing cavity and corresponding to the coil.

6. The fan module as claimed in claim 1, wherein the electronic device comprises a main body and a cover body, the cover body is open or closed relative to the main body, the fan module is disposed in one of the main body and the cover body, when the cover body is closed relative to the main body, another of the main body and the cover body position-limits the second pivot portion in the first containing cavity, and when the cover body is open relative to the main body, the second pivot portion protrudes out of the first containing cavity.

7. The fan module as claimed in claim 6, wherein when the cover body is open relative to the main body, the second pivot portion protrudes out of the first containing cavity due to gravity.

8. The fan module as claimed in claim 6, wherein the electronic device further comprises a linking mechanism disposed in one of the main body and the cover body and connected to the second pivot portion, and when the cover body is open relative to the main body, the linking mechanism drives the second pivot portion to protrude out of the first containing cavity.

9. The fan module as claimed in claim 6, wherein the electronic device further comprises a connection port disposed on the cover body, when the cover body is closed relative to the main body, the connection port is hidden in the main body, and when the cover body is open relative to the main body, the connection port is exposed.

* * * * *